(12) United States Patent
Cheng

(10) Patent No.: US 11,038,040 B2
(45) Date of Patent: Jun. 15, 2021

(54) FIN FIELD EFFECT TRANSISTOR DEVICES WITH ROBUST GATE ISOLATION

(71) Applicant: INTERNATIONAL BUSINESS MACHINES CORPORATION, Armonk, NY (US)

(72) Inventor: Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/884,818

(22) Filed: May 27, 2020

(65) Prior Publication Data
US 2020/0381536 A1 Dec. 3, 2020

Related U.S. Application Data

(63) Continuation of application No. 16/424,999, filed on May 29, 2019, now Pat. No. 10,707,325.

(51) Int. Cl.
*H01L 21/00* (2006.01)
*H01L 29/00* (2006.01)
(Continued)

(52) U.S. Cl.
CPC ........... *H01L 29/66545* (2013.01); *H01L 21/823418* (2013.01); *H01L 21/823437* (2013.01); *H01L 21/823814* (2013.01); *H01L 21/823864* (2013.01); *H01L 21/823878* (2013.01); *H01L 29/66484* (2013.01)

(58) Field of Classification Search
CPC ..... H01L 21/823418; H01L 21/823437; H01L 21/823814; H01L 21/823864; H01L 21/823878; H01L 29/66545; H01L 29/66484; H01L 29/66795; H01L 29/785; H01L 29/7848; H01L 29/0847
See application file for complete search history.

(56) References Cited

U.S. PATENT DOCUMENTS 9,520,482 B1 12/2016 Chang et al.
9,551,923 B2 1/2017 Wang et al.
(Continued)

OTHER PUBLICATIONS

List of IBM Patents or Patent Applications Treated as Related dated May 27, 2020, 2 pages.

*Primary Examiner* — Nikolay K Yushin
(74) *Attorney, Agent, or Firm* — Tutunjian & Bitetto, P.C.; Randall Bluestone

(57) ABSTRACT

A method of forming a complementary metal oxide semiconductor (CMOS) device is provided. The method includes forming a plurality of vertical fins on a substrate, and forming at least two dummy gates across the plurality of vertical fins. The method further includes forming a masking block on one of the at least two dummy gates, and removing the portions of the at least two dummy gates not covered by the masking block, wherein the portion of the one dummy gate covered by the masking block forms a dummy gate plug. The method further includes forming a gate dielectric layer on the exposed surfaces of the plurality of vertical fins and dummy gate plug, and forming a conductive gate layer on the gate dielectric layer, wherein the dummy gate plug physically separates two active gate structures.

19 Claims, 10 Drawing Sheets

(51) Int. Cl.
*H01L 29/66* (2006.01)
*H01L 21/8234* (2006.01)
*H01L 21/8238* (2006.01)

(56) References Cited

U.S. PATENT DOCUMENTS

| | | |
|---|---|---|
| 9,601,366 B2 | 3/2017 | Greene et al. |
| 9,721,848 B1 | 8/2017 | Bu et al. |
| 9,786,507 B2 | 10/2017 | Anderson et al. |
| 9,805,983 B1 | 10/2017 | Cheng et al. |
| 9,911,736 B1 | 3/2018 | Zang et al. |
| 9,917,085 B2 * | 3/2018 | Lin ................. H01L 21/823431 |
| 10,090,325 B1 | 10/2018 | Liaw |
| 2006/0125024 A1 | 6/2006 | Ishigaki |
| 2017/0345820 A1 * | 11/2017 | Lin ................... H01L 29/66818 |

\* cited by examiner

US 11,038,040 B2

FIN FIELD EFFECT TRANSISTOR DEVICES WITH ROBUST GATE ISOLATION

BACKGROUND

The present invention generally relates to fin field effect transistors, and more particularly to fin field effect transistors with reduced spacing between adjacent gate structures.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming a complementary metal oxide semiconductor (CMOS) device is provided. The method includes forming a plurality of vertical fins on a substrate, and forming at least two dummy gates across the plurality of vertical fins. The method further includes forming a masking block on one of the at least two dummy gates, and removing the portions of the at least two dummy gates not covered by the masking block, wherein the portion of the one dummy gate covered by the masking block forms a dummy gate plug. The method further includes forming a gate dielectric layer on the exposed surfaces of the plurality of vertical fins and dummy gate plug, and forming a conductive gate layer on the gate dielectric layer, wherein the dummy gate plug physically separates two active gate structures.

In accordance with another embodiment of the present invention, a method of forming a complementary metal oxide semiconductor (CMOS) device is provided. The method includes forming a plurality of vertical fins on a substrate, and forming a bottom isolation layer on the substrate between the vertical fins. The method further includes forming at least two dummy gates across the plurality of vertical fins, wherein the dummy gate are not made of a conductor or semiconductor material, and forming sidewall spacers on each of the at least two dummy gates. The method further includes forming a masking block on a central portion of one of the at least two dummy gates, and removing the portions of the at least two dummy gates not covered by the masking block, wherein the portion of the one dummy gate covered by the masking block forms a dummy gate plug between the sidewall spacers. The method further includes forming a gate dielectric layer on the exposed surfaces of the plurality of vertical fins, bottom isolation layer, and dummy gate plug, and forming a conductive gate layer on the gate dielectric layer, wherein the dummy gate plug physically separates two active gate structures.

In accordance with yet another embodiment of the present invention, a complementary metal oxide semiconductor (CMOS) device is provided. The CMOS device includes an insulating dummy gate plug between a pair of adjacent vertical fins on a substrate. The CMOS device further includes a first active gate structure on one of the pair of vertical fins, a second active gate on another one of the pair of vertical fins, wherein the dummy gate plug separates the first active gate structure from the second active gate structure, and a third active gate structure that is across the pair of adjacent vertical fins.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate to fabricating a complementary metal oxide semiconductor (CMOS) device from closely spaced vertical fin field effect transistor devices using a partial gate replacement process to form an isolation feature between the endwalls of two adjacent gate structure segments. Use of an electrically insulating material rather than a conductive material for the dummy gate allows formation of the isolation feature as a step in the replacement metal gate (RMG) process.

Embodiments of the present invention relate to fabricating a complementary metal oxide semiconductor (CMOS) device with an insulating plug between the endwalls of two adjacent gate structure segments, where the insulating plug is formed from an insulating dummy gate material. The resulting fin spacing and gate segment spacing can, thereby, be reduced to decrease the area of the CMOS device on the substrate.

Embodiments of the present invention relate to using amorphous carbon (a-C) for the dummy gate material, so a portion of the dummy gate can form an isolation feature between the endwalls of two adjacent gate structure segments after replacing adjacent portions of the dummy gate with active gates including a gate dielectric layer and conductive gate layer. The two adjacent gate structure segments can extend past the sidewalls of directly adjacent vertical fins by a predetermined distance of about twice the width of the gate structure, while having an isolation feature between the gate structure endwalls of less than about 20 nanometers (nm).

Exemplary applications/uses to which the present invention can be applied include, but are not limited to: complementary metal oxide semiconductor (CMOS) device for login devices and memory devices.

It is to be understood that aspects of the present invention will be described in terms of a given illustrative architecture; however, other architectures, structures, substrate materials and process features and steps can be varied within the scope of aspects of the present invention.

Figure 1:
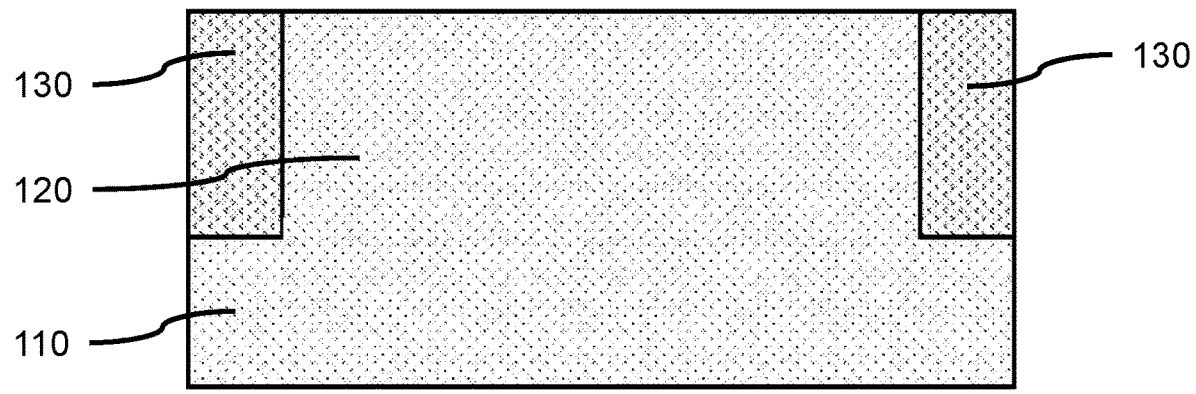
FIG. 1 is a cross-sectional side view showing the long axis of a vertical fin on a substrate bounded by isolation regions, in accordance with an embodiment of the present invention.

Referring now to the drawings in which like numerals represent the same or similar elements and initially to FIG. 1, a cross-sectional side view of the long axis of a vertical fin on a substrate bounded by isolation regions is shown, in accordance with an embodiment of the present invention.

In one or more embodiments, a substrate 110 can be a semiconductor wafer or a semiconductor-on-insulator (SeOI) wafer, for example, a silicon-on-insulator (SOI) wafer.

In various embodiments, the substrate 110 can a semiconductor, including, but not limited to, silicon (Si), silicon-germanium (SiGe), silicon carbide (SiC), or germanium (Ge), where a surface of the semiconductor can be exposed. The substrate 110 can be a single crystal semiconductor, where the expose surface can provide a surface for epitaxial or heteroepitaxial growth of other semiconductor materials.

In one or more embodiments, a plurality of vertical fins 120 can be formed on the substrate 110, where the vertical fins can be formed by an image transfer process or direct-write lithography process. In various embodiments, the image transfer process can be a sidewall image transfer (SIT) processes, for example, self-aligned single patterning (SASP), self-aligned double patterning (SADP), self-aligned triple patterning (SATP), or self-aligned quadruple patterning (SAQP). Direct write processes can utilize electron beam (EB), extreme ultraviolet (EUV), or x-ray lithography processes.

In various embodiments, the vertical fins 120 can undergo a fin-cut process, where portions of long vertical fins can be removed to form vertical fins 120 of a predetermined length. In various embodiments, vertical fins 120 can have a length in a range of about 20 nanometers (nm) to about 300 nm, or about 40 nm to about 100 nm, although other lengths are also contemplated. The vertical fin length can be sufficient for forming at least two active gates cross the fins.

In one or more embodiments, the space between the endwalls of adjacent vertical fins 120 can be filled with a dielectric material to form isolation regions 130 on opposite ends of the vertical fin 120. In various embodiments, the isolation regions 130 can be a dielectric material including, but not limited to, silicon oxide (SiO), silicon nitride (SiN), silicon oxynitride (SiON), silicon boronitride (SiBN), silicon carbonitride (SiCN), silicon boro carbonitride (SiBCN), a low-k dielectric material, or a combination thereof. A low-k dielectric material can be, for example, fluorine doped silicon oxide (SiO:F), carbon doped silicon oxide (SiO:C), hydrogen silsesquioxane (HSQ), methylsilsesquioxane (MSQ), tetraethoxysilane (TEOS), and combinations thereof. If the vertical fins 120 are formed on an SeOI substrate, isolation regions 130 between adjacent fins may be excluded, as the buried oxide layer in the SeOI substrate can provide the electrical isolation between devices.

In various embodiments, the vertical fins 120 can be the same semiconductor material as the substrate 110, where the vertical fins are formed from the substrate. In various embodiments, the vertical fins 120 can be a different semiconductor material from the substrate 110, where the vertical fins 120 are formed from a layer of a different material formed on the surface of the substrate 110.

Figure 2:
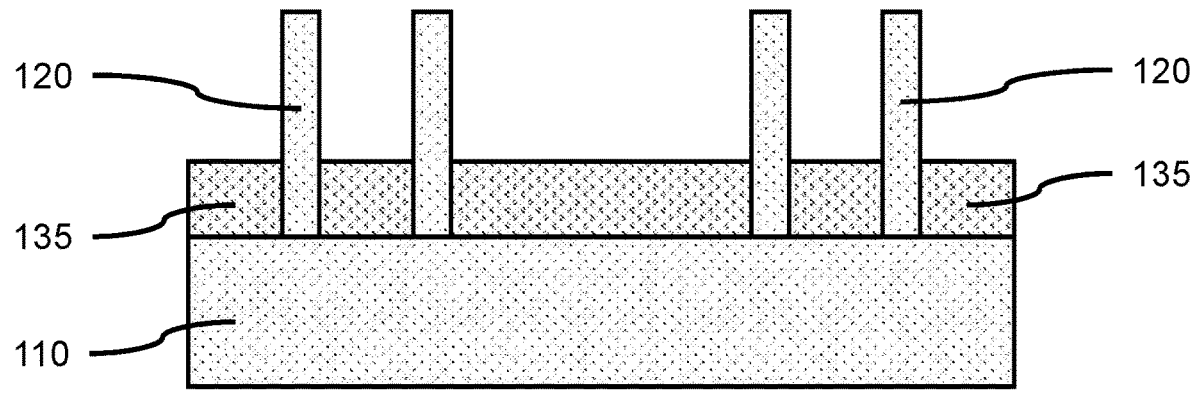
FIG. 2 is a cross-sectional side view perpendicular to FIG. 1 showing a plurality of vertical fins on a substrate with a bottom isolation layer between the vertical fins, in accordance with an embodiment of the present invention.

FIG. 2 is a cross-sectional side view perpendicular to FIG. 1 showing a plurality of vertical fins on a substrate with a bottom isolation layer between the vertical fins, in accordance with an embodiment of the present invention.

In one or more embodiments, a bottom isolation layer 135 can be formed on the substrate 110 between the vertical fins 120, where the bottom isolation layer 135 can be formed by a directional deposition, for example, high density plasma (HDP) or gas cluster ion beam (GCIB), or a blanket deposition, for example, chemical vapor deposition (CVD) or plasma enhanced CVD (PECVD), and etched back to a predetermined height.

In various embodiments, the bottom isolation layer 135 can be a dielectric material including, but not limited to, silicon oxide (SiO), silicon nitride (SiN), silicon oxynitride (SiON), silicon boronitride (SiBN), silicon carbonitride (SiCN), silicon boro carbonitride (SiBCN), a low-k dielectric material, or a combination thereof. The bottom isolation layer 135 can be the same insulating dielectric material as the isolation regions 130 or a different insulating dielectric material.

In various embodiments, the vertical fins 120 can have a height in a range of about 20 nm to about 70 nm, or about 30 nm to about 40 nm, although other heights are also contemplated.

In various embodiments, the bottom isolation layer 135 can have a thickness in a range of about 10 nm to about 40 nm, or about 20 nm to about 30 nm, although other heights are also contemplated. The bottom isolation layer 135, if present, can cover about ⅓ to about ⅗ of the vertical fins 120.

Figure 3:
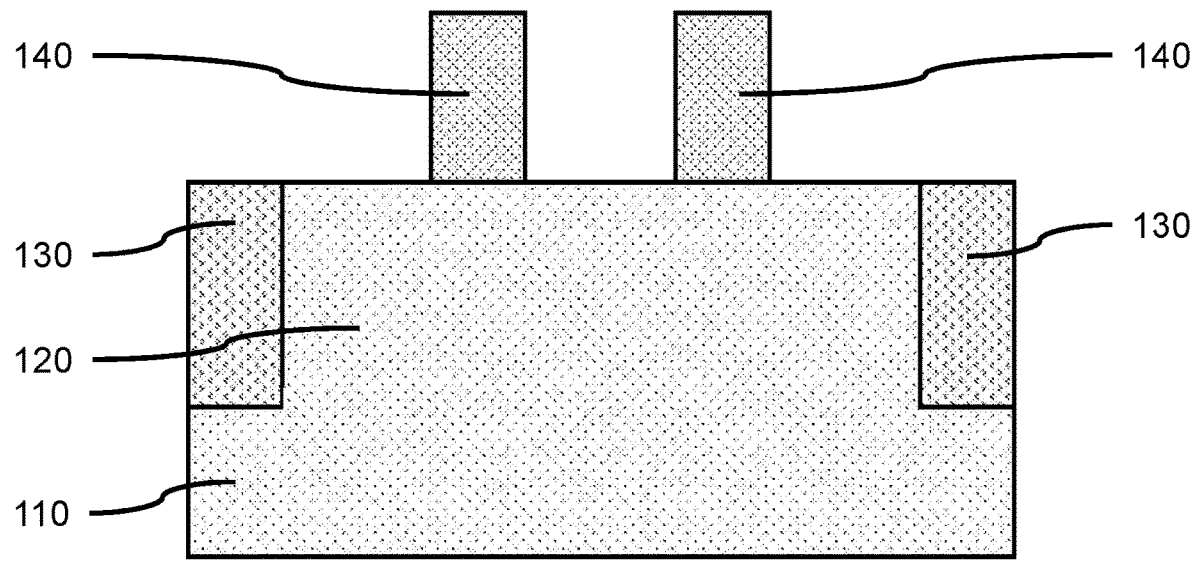
FIG. 3 is a cross-sectional side view showing the long axis of the vertical fin with a pair of dummy gates over the vertical fin, in accordance with an embodiment of the present invention.

FIG. 3 is a cross-sectional side view showing the long axis of the vertical fin with a pair of dummy gates over the vertical fin, in accordance with an embodiment of the present invention.

In one or more embodiments, a pair of dummy gates 140 can be formed over the plurality of vertical fins 120, where the dummy gates can be an electrically insulating material. The dummy gates 140 can be formed by depositing a layer of the electrically insulating material on the vertical fins 120, isolation regions 130, and bottom isolation layer 135, for example, by a blanket deposition. The layer of the electrically insulating material can fill in the space between the vertical fins. The layer of the electrically insulating material can be patterned using lithographic processes and etching, for example, reactive ion etching (RIE), to form dummy gates 140.

In various embodiments, the dummy gates 140 can be an electrically insulating dielectric material including, but not limited to, amorphous carbon (a-C), silicon oxide (SiO), silicon nitride (SiN), silicon oxynitride (SiON), silicon boronitride (SiBN), silicon carbonitride (SiCN), silicon boro carbonitride (SiBCN), or a combination thereof. In various embodiments, the dummy gate layer and dummy gates 140 are not silicon (Si), including amorphous silicon (a-Si) and poly-silicon (p-Si), silicon-germanium (SiGe), silicon carbide (SiC), or other semiconductor or conductive materials.

In various embodiments, the dummy gates 140 can have a width in a range of about 15 nm to about 50 nm, or about 20 nm to about 30 nm, although other widths are also contemplated.

In a non-limiting exemplary embodiment, the dummy gates 140 can be amorphous carbon (a-C) athwart at least a pair of adjacent vertical fins 120.

Figure 4:
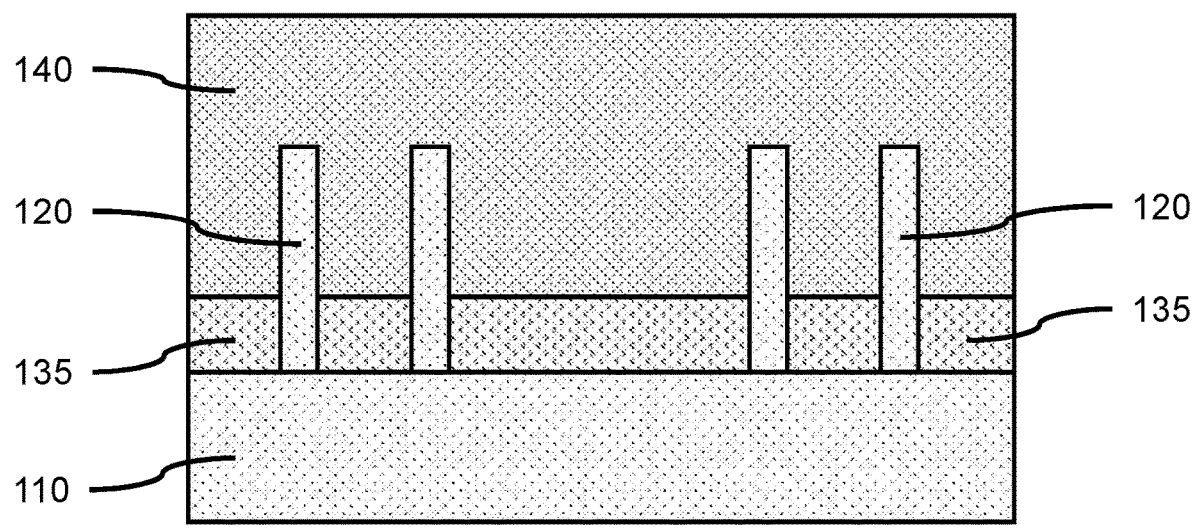
FIG. 4 is a cross-sectional side view perpendicular to FIG. 3 showing the dummy gate on the bottom isolation layer and across the plurality of vertical fin, in accordance with an embodiment of the present invention.

FIG. 4 is a cross-sectional side view perpendicular to FIG. 3 showing the dummy gate on the bottom isolation layer and across the plurality of vertical fin, in accordance with an embodiment of the present invention.

In various embodiments, the dummy gate layer can cover the bottom isolation layer 135 and vertical fins 120. A chemical-mechanical polishing (CMP) can be used to planarize the dummy gate layer to provide a smooth, flat surface from which the and dummy gates 140 with a predetermined height can be formed using lithographic processes and etching.

In various embodiments, the dummy gates 140 can have a height in a range of about 70 nm to about 150 nm, or about 100 nm to about 120 nm, although other heights are also contemplated. The dummy gates 140 can extend above the plurality of vertical fins 120.

Figure 5:
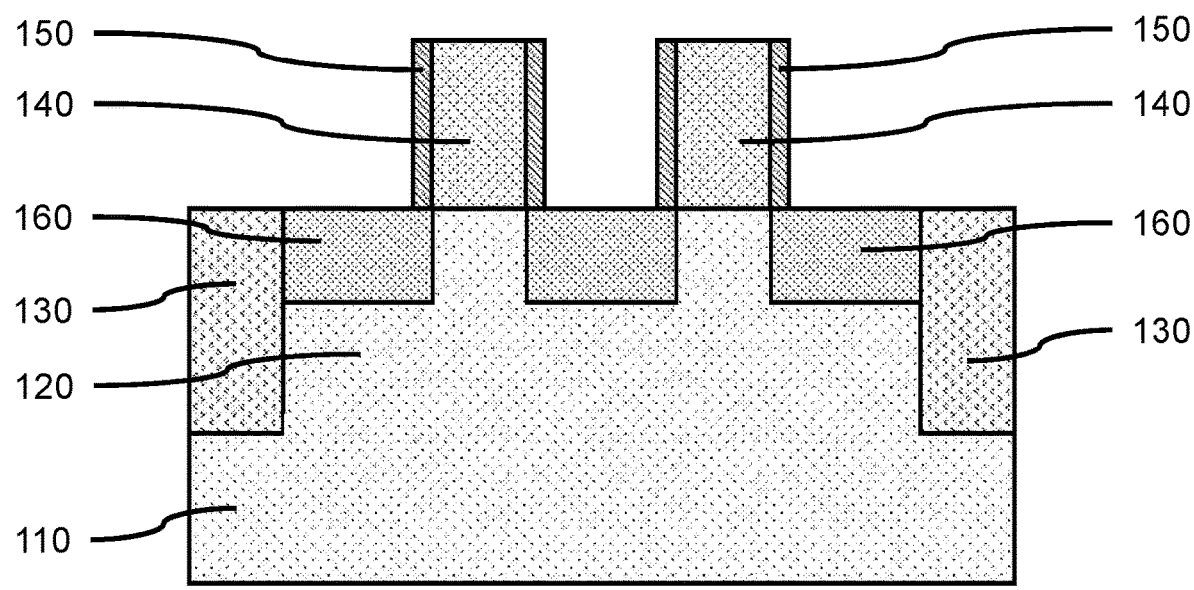
FIG. 5 is a cross-sectional side view showing the long axis of the vertical fin with sidewall spacers on each of the pair of dummy gates, and source/drains formed on the vertical fin, in accordance with an embodiment of the present invention.

FIG. 5 is a cross-sectional side view showing the long axis of the vertical fin with sidewall spacers on each of the pair of dummy gates, and source/drains formed on the vertical fin, in accordance with an embodiment of the present invention.

In one or more embodiments, sidewall spacers 150 can be formed on the dummy gates 140, where the sidewall spacers 150 can be formed by a conformal deposition, including, but not limited to, atomic layer deposition (ALD), plasma enhanced ALD (PEALD), and combinations thereof.

In various embodiments, the sidewall spacers 150 can be a dielectric material including, but not limited to, silicon oxide (SiO), silicon nitride (SiN), silicon oxynitride (SiON), silicon boronitride (SiBN), silicon carbonitride (SiCN), silicon boro carbonitride (SiBCN), a low-k dielectric material, or a combination thereof. The sidewall spacers 150 can be a different dielectric material from the bottom isolation layer 135 and isolation regions 130, so the different features can be selectively etched.

In one or more embodiments, a source/drain 160 can be formed on each of the vertical fins 120, where the source/drains 160 can be formed by implantation (e.g., ion beam implantation, diffusion doping, etc.) and/or an epitaxial or heteroepitaxial growth process, for example, molecular beam epitaxy (MBE), liquid phase epitaxy (LPE), or gas phase epitaxy (GPE). In various embodiments, the vertical fins 120 can be recessed before epitaxial growth of the source/drains 160, or the source/drains can be grown on the fin sidewalls without recessing. In various embodiments, the vertical fins can be recessed before epitaxial growth of the source/drains 160. The source/drains 160 can be doped to be an n-type source/drain or a p-type source/drain, where the dopant(s) can be introduced in situ (i.e., during formation of a layer) or ex situ (i.e., after formation of a layer). In various embodiments, n-type dopants can be, for example, phosphorus (P) or arsenic (As), and p-type dopants can be, for example, boron (B) or gallium (Ga). In various embodiments, the first bottom source/drain layer 160 can be a semiconductor material, including, but not limited to n-type (e.g., P or As) doped silicon (Si) or p-type (e.g., B) doped silicon-germanium (SiGe). The source/drain 160 can be the same semiconductor material as the vertical fins 120 or different.

In various embodiments, the source/drain 160 can be formed on opposite sides of each of the dummy gates 140, so the dummy gates 140 and source/drain 160 form horizontal transport fin field effect transistor (HT FinFETs) devices.

Figure 6:
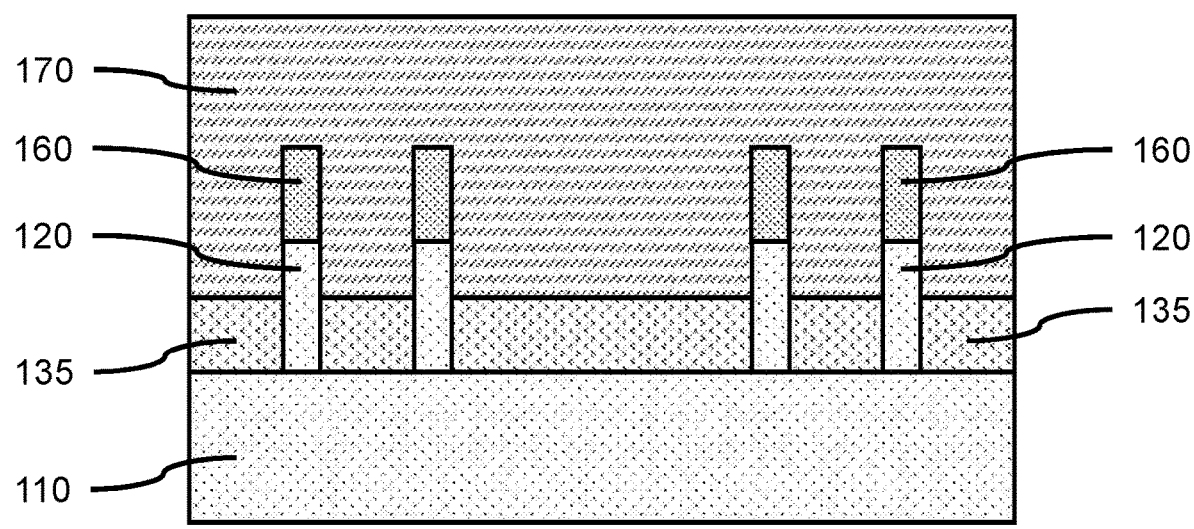
FIG. 6 is a cross-sectional side view perpendicular to FIG. 5 showing the source/drains on the vertical fins, in accordance with an embodiment of the present invention.

FIG. 6 is a cross-sectional side view perpendicular to FIG. 5 showing the source/drains on the vertical fins, in accordance with an embodiment of the present invention.

In one or more embodiments, the source/drain 160 can be on the top portions of the vertical fins, where the source/drain 160 are above the bottom isolation layer 135.

In one or more embodiments, an interlayer dielectric (ILD) layer 170 can be formed on the vertical fins 120, source/drains 160, and bottom isolation layer 135, where the ILD layer 170 can be formed by a blanket deposition, for example, chemical vapor deposition (CVD), plasma enhanced CVD (PECVD), spin-on process, or a combination thereof.

In various embodiments, the interlayer dielectric (ILD) layer 170 can be a dielectric material including, but not limited to, silicon oxide (SiO), silicon nitride (SiN), silicon oxynitride (SiON), silicon boronitride (SiBN), silicon carbonitride (SiCN), silicon boro carbonitride (SiBCN), a low-k dielectric material, or a combination thereof.

Figure 7:
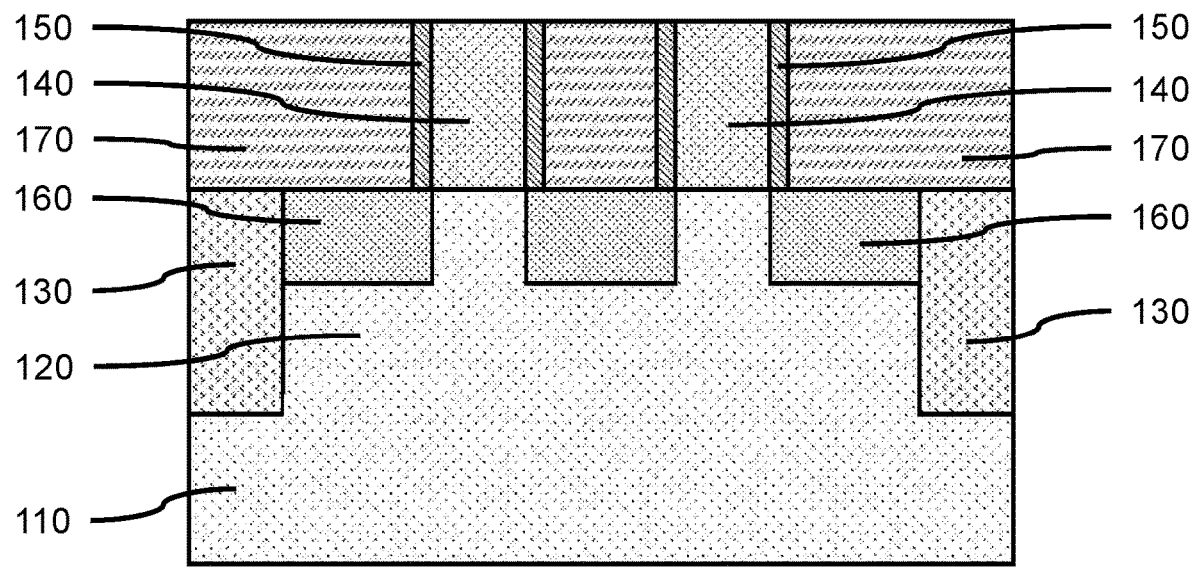
FIG. 7 is a cross-sectional side view showing the long axis of the vertical fin with an interlayer dielectric (ILD) layer on the vertical fin, source/drains, isolation regions, and sidewall spacers, in accordance with an embodiment of the present invention.

FIG. 7 is a cross-sectional side view showing the long axis of the vertical fin with an interlayer dielectric (ILD) layer on the vertical fin, source/drains, isolation regions, and sidewall spacers, in accordance with an embodiment of the present invention.

In one or more embodiments, the interlayer dielectric (ILD) layer 170 can be formed on the vertical fins 120, source/drains 160, isolation regions 130, and sidewall spacers 150. The ILD layer 170 can be planarized using CMP to expose the dummy gates 140 and to provide a smooth, flat surface.

Figure 8:
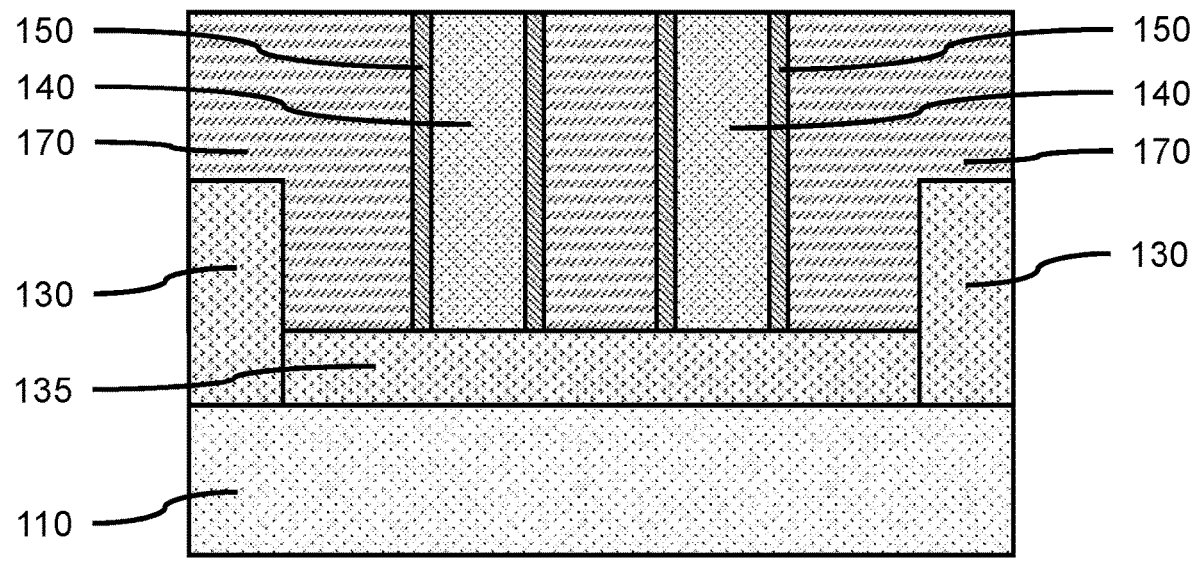
FIG. 8 is a cross-sectional side view parallel with FIG. 7 showing the interlayer dielectric (ILD) layer between the vertical fins and sidewall spacers, in accordance with an embodiment of the present invention.

FIG. 8 is a cross-sectional side view parallel with FIG. 7 showing the interlayer dielectric (ILD) layer between the vertical fins and sidewall spacers, in accordance with an embodiment of the present invention.

In various embodiments, the interlayer dielectric (ILD) layer 170 can fill in the spaces between the sidewall spacer layers 150 on the dummy gates 140 and between the vertical fins 120. The interlayer dielectric (ILD) layer 170 can cover portions of the bottom isolation layer 135 between the vertical fins 120.

Figure 9:
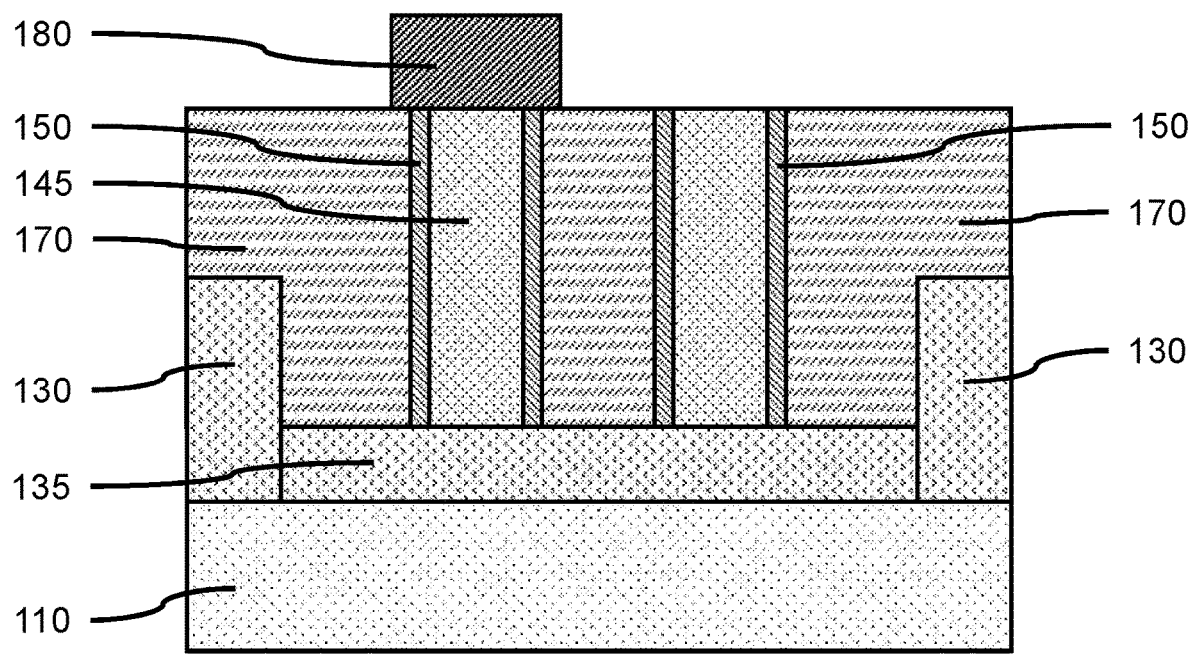
FIG. 9 is a cross-sectional side view parallel to the long axis of the vertical fin showing a masking block on a dummy gate over the vertical fin, in accordance with an embodiment of the present invention.

FIG. 9 is a cross-sectional side view parallel to the long axis of the vertical fin showing a masking block on a dummy gate over the vertical fin, in accordance with an embodiment of the present invention.

In one or more embodiments, a masking block 180 can be formed on a dummy gate 140 between an adjacent pair of the plurality of vertical fins 120, where the masking block 180 can be a hardmask. The masking block 180 can be formed by depositing a layer of a hardmask material on the dummy gates 140 and ILD layer 170, and patterning the hardmask layer using lithographic processes and selective etching. Alternatively, the masking block 180 can be a soft mask with photoresist or organic materials, or a combination of a soft mask and hardmask.

In various embodiments, the masking block(s) 180 can be a dielectric hardmask material including, but not limited to, silicon oxide (SiO), silicon nitride (SiN), silicon oxynitride (SiON), silicon boronitride (SiBN), silicon carbonitride (SiCN), silicon boro carbonitride (SiBCN), or a combination thereof.

Figure 10:
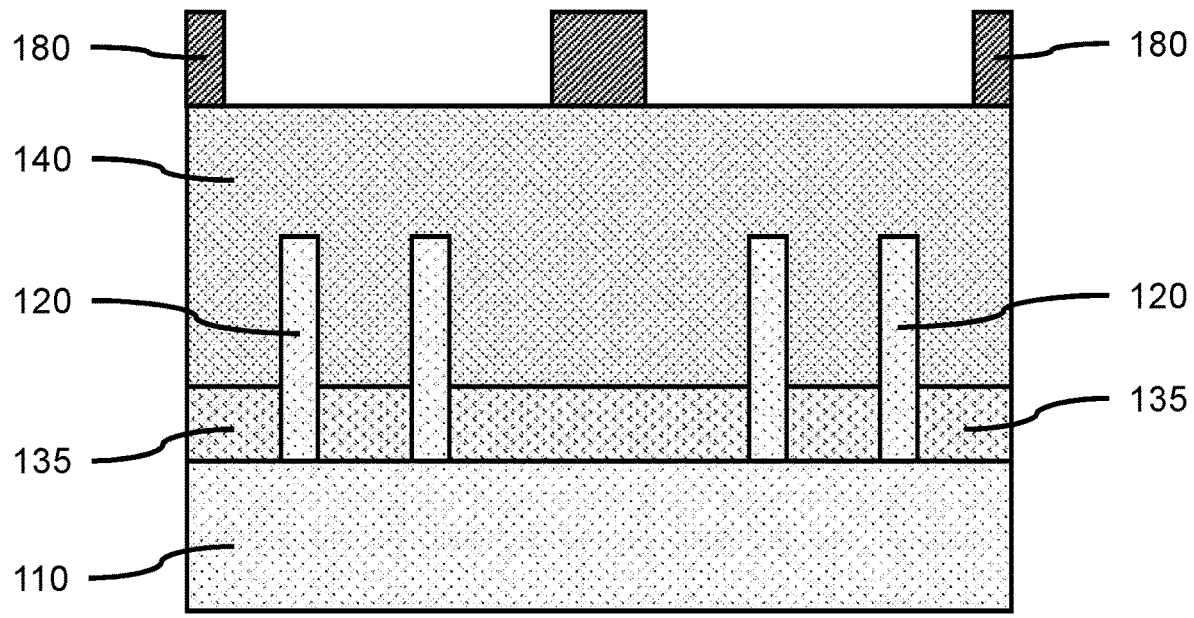
FIG. 10 is a cross-sectional side view perpendicular to FIG. 9 showing a plurality of masking blocks on the dummy gate offset from the locations of the vertical fins, in accordance with an embodiment of the present invention.

FIG. 10 is a cross-sectional side view perpendicular to FIG. 9 showing a plurality of masking blocks on the dummy gate offset from the locations of the vertical fins, in accordance with an embodiment of the present invention.

In various embodiments, a plurality of masking blocks 180 can be formed on the dummy gates 140, where the masking blocks 180 can be positioned over regions of the substrate not occupied by vertical fins 120. The masking blocks 180 can be located on sections of the dummy gates 140 between directly adjacent vertical fins.

Figure 11:
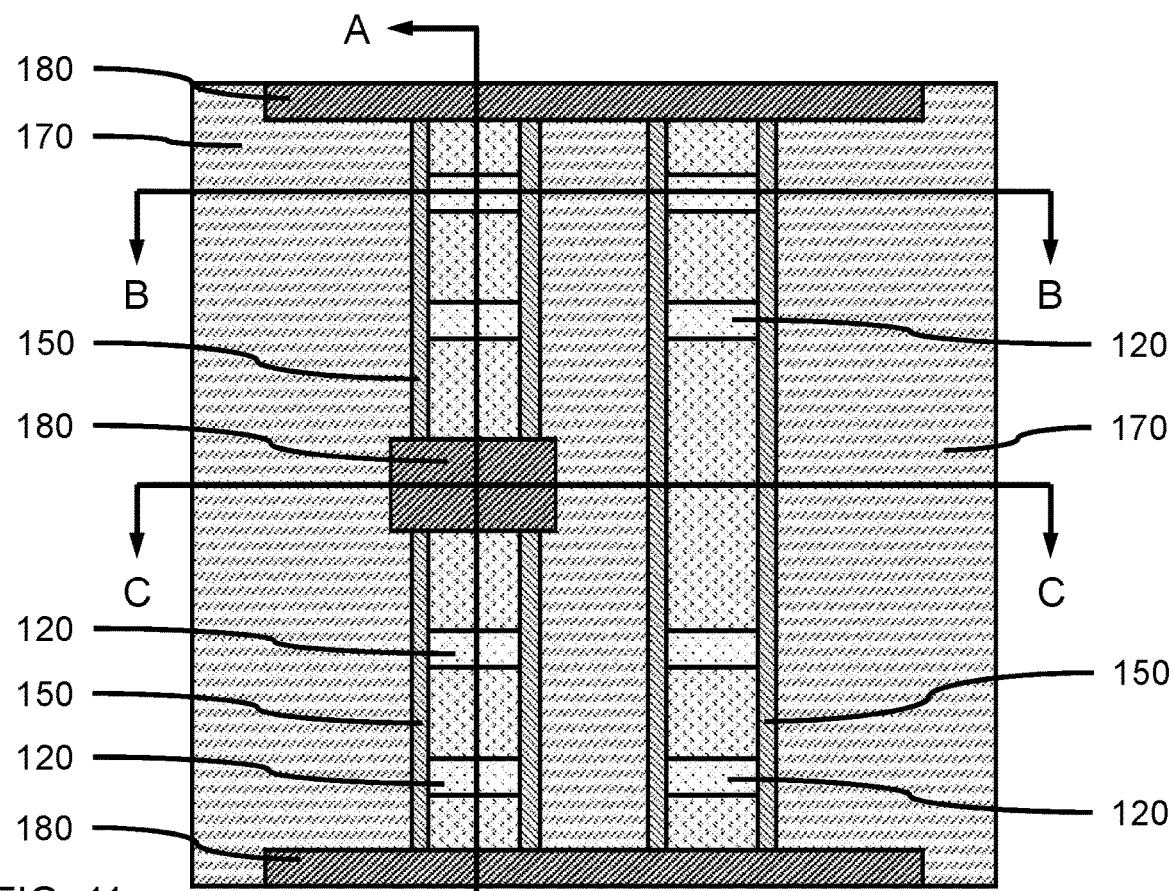
FIG. 11 is a top view showing the positions of the plurality of masking blocks on the dummy gates and ILD layer relative to the vertical fins and sidewall spacers after portions of the dummy gates have been removed, in accordance with an embodiment of the present invention.

FIG. 11 is a top view showing the positions of the plurality of masking blocks on the dummy gates and ILD layer relative to the vertical fins and sidewall spacers after portions of the dummy gates have been removed, in accordance with an embodiment of the present invention.

In one or more embodiments, a masking block 180 can be located on a central portion of one of the plurality of dummy gates 140, and masking blocks 180 can be located at opposite end portions of each of the dummy gates 140. The masking block 180 can cover a portion of the dummy gates 140 and extend over the sidewall spacers 150. Portions of the masking blocks 180 can be on the ILD layer 170.

In one or more embodiments, portions of the dummy gates 140 not covered by the masking blocks 180 can be removed using a selective directional etch, for example, RIE. Removal of the portions of the dummy gates 140 can expose the underlying sections of the vertical fins 120 and bottom isolation layer 135 between sidewall spacers 150. The central portion of the dummy gate 140 covered by masking block 180 can remain after etching to form a dummy gate plug.

Figure 12:
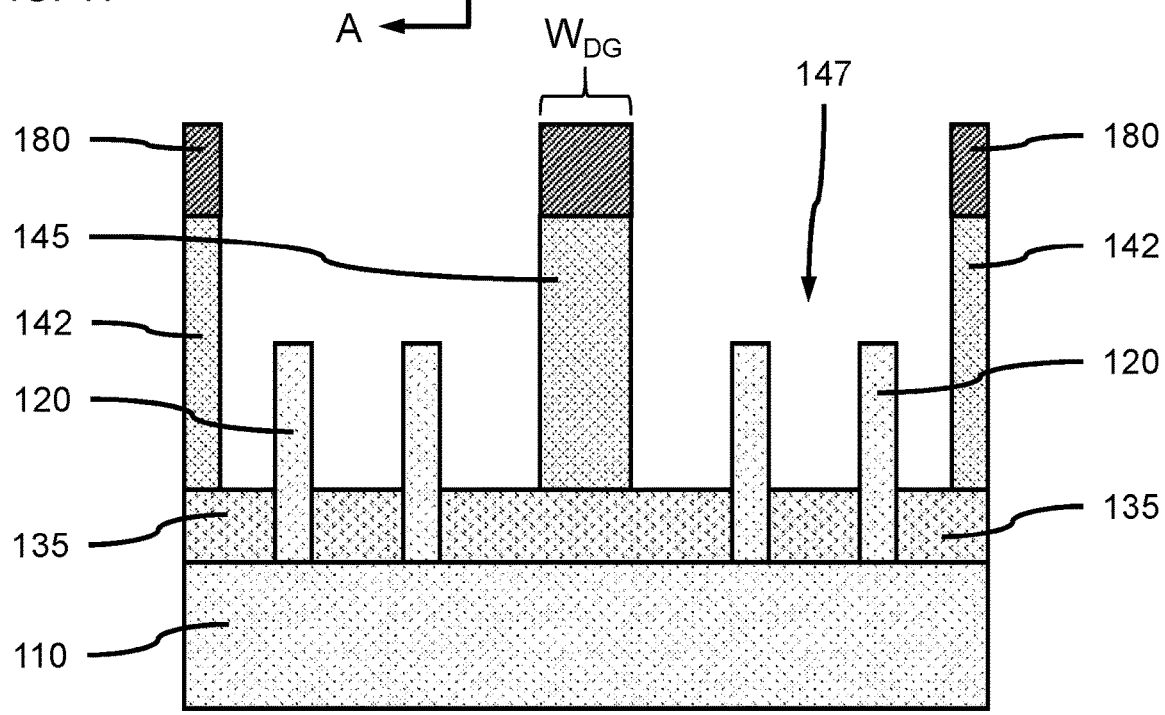
FIG. 12 is the A-A cross-section of FIG. 11 showing a portion of the dummy gate removed from the vertical fins, in accordance with an embodiment of the present invention.

FIG. 12 is the A-A cross-section of FIG. 11 showing a portion of the dummy gate removed from the vertical fins, in accordance with an embodiment of the present invention.

In one or more embodiments, the portion of the dummy gate 140 can be removed from between a dummy gate plug 145 between two inner adjacent vertical fins and a dummy gate pillar 142 adjacent to an outer vertical fin. The dummy gate plug 145 and dummy gate pillars 142 can be on the bottom isolation layer 135. Removal of the portion(s) of the dummy gate 140 can form gate channel(s) that expose a portion of the vertical fins between sidewall spacers 150.

In various embodiments, the dummy gate plug 145 can have a width, $W_{DG}$, taking up a space between the sidewall spacers 150 in a range of about 10 nm to about 60 nm, or about 20 nm to about 30 nm, although other widths are also contemplated.

Figure 13:
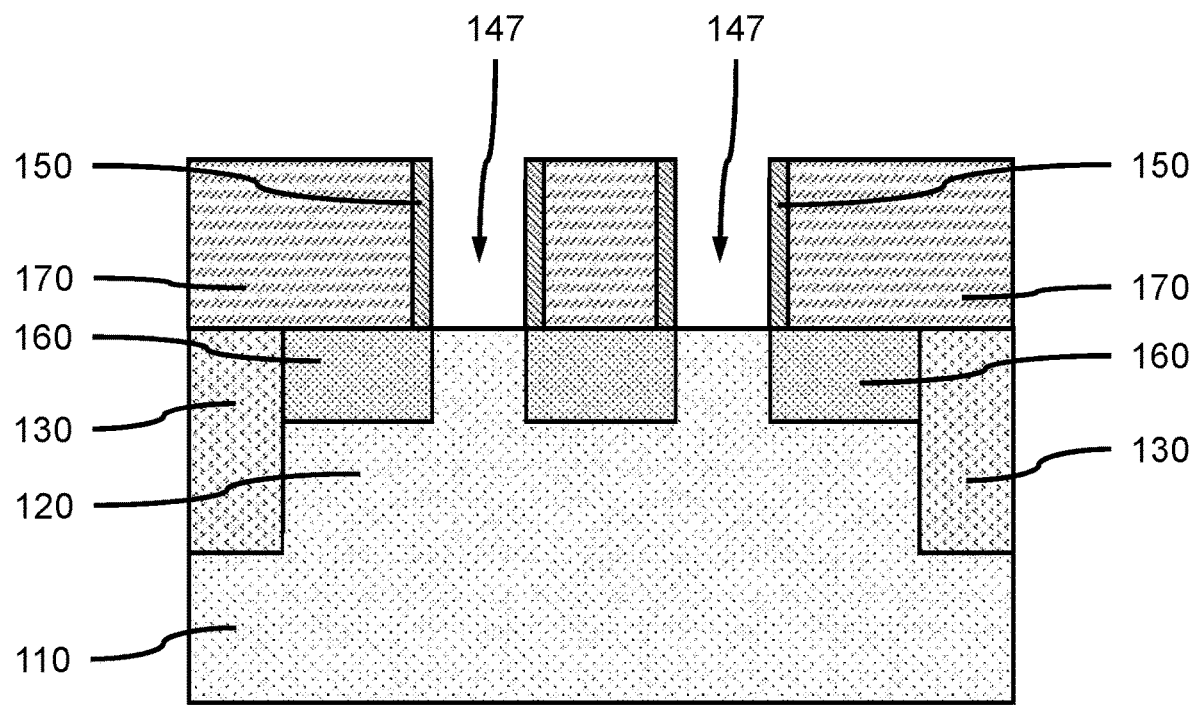
FIG. 13 is the B-B cross-section of FIG. 11 showing the long axis of the vertical fin with a portion of the dummy gates removed from the vertical fin, in accordance with an embodiment of the present invention.

FIG. 13 is the B-B cross-section of FIG. 11 showing the long axis of the vertical fin with a portion of the dummy gates removed from the vertical fin, in accordance with an embodiment of the present invention.

In one or more embodiments, portions of the dummy gates 140 can be removed from the top surfaces and sidewalls of both vertical fins 120 to form gate channels 147, where the portions removed can be between sidewall spacers 150 and source/drains 160.

Figure 14:
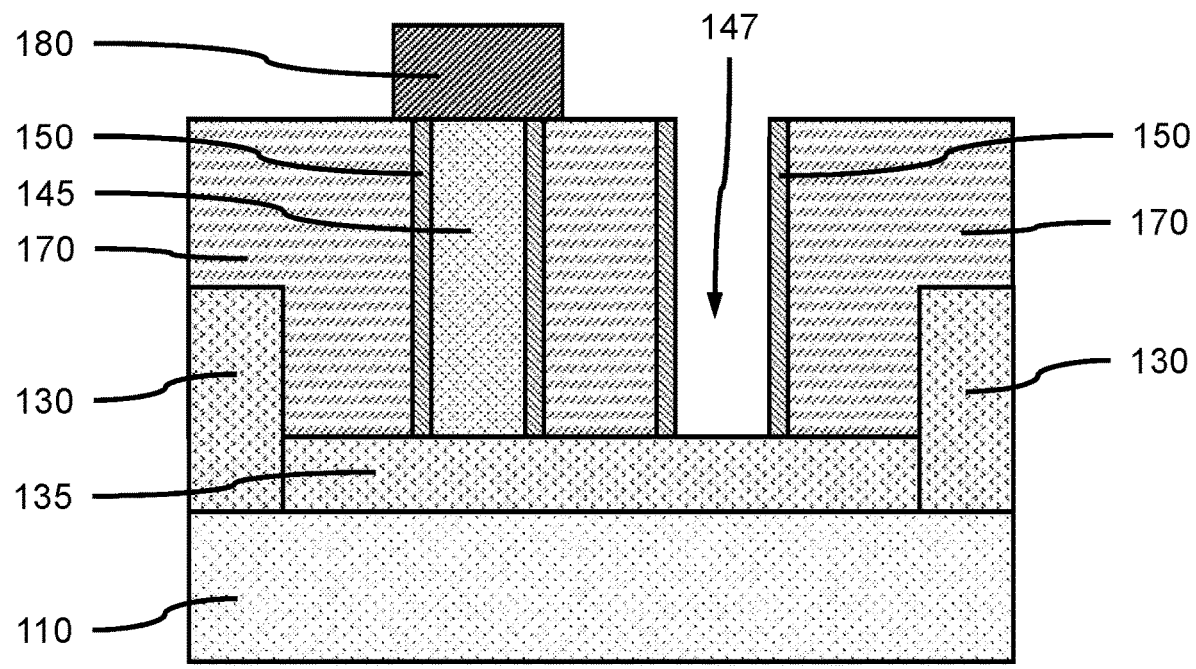
FIG. 14 is the C-C cross-section of FIG. 11 showing the dummy gate plug and a dummy gate removed to expose a portion of the bottom isolation layer between adjacent vertical fins, in accordance with an embodiment of the present invention.

FIG. 14 is the C-C cross-section of FIG. 11 showing the dummy gate plug and a dummy gate removed to expose a portion of the bottom isolation layer between adjacent vertical fins, in accordance with an embodiment of the present invention.

In one or more embodiments, the removed portion of one of the dummy gates 140 can form a gate channel 147 that expose a portion of the bottom isolation layer 135 between adjacent vertical fins 120, whereas the dummy gate plug 145 formed from the other dummy gate 140 can remain between the sidewall spacers 150 and extend to the bottom isolation layer 135. The dummy gate plug 145 can fill in the space between a section of the sidewall spacers 150.

Figure 15:
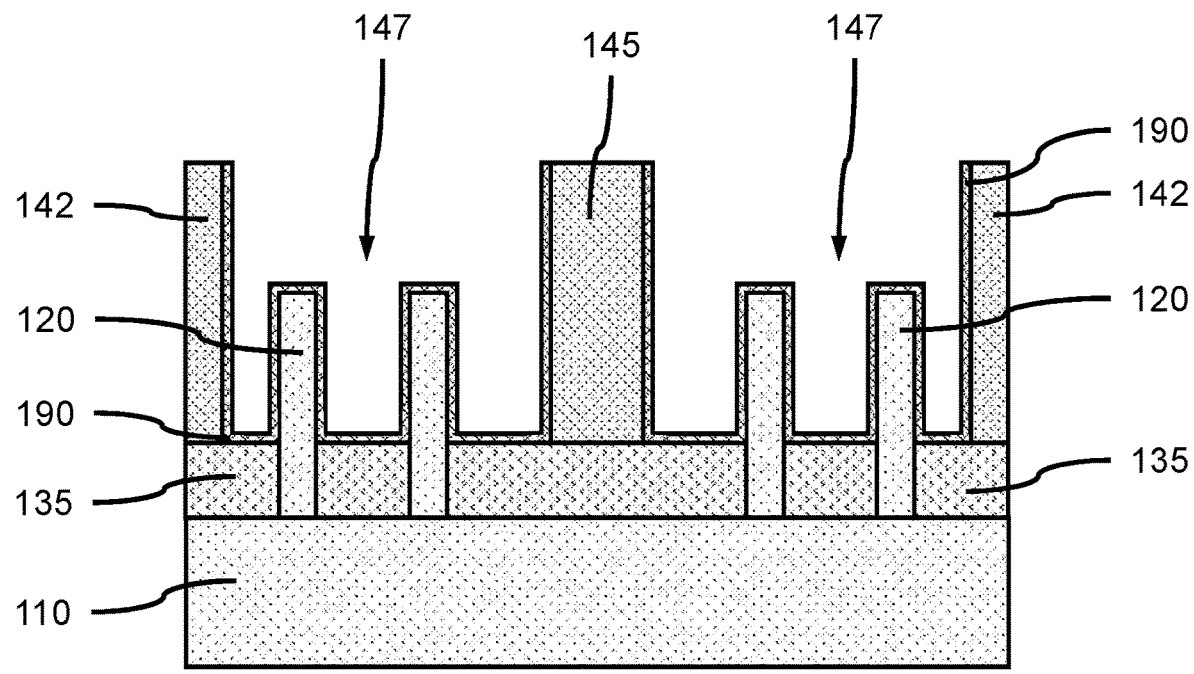
FIG. 15 is a cross-sectional side view perpendicular to FIG. 14 showing a gate dielectric layer on the plurality of vertical fins and bottom isolation layer, in accordance with an embodiment of the present invention.

FIG. 15 is a cross-sectional side view perpendicular to FIG. 14 showing a gate dielectric layer on the plurality of vertical fins and bottom isolation layer, in accordance with an embodiment of the present invention.

In various embodiments, the masking blocks 180 can be removed from the dummy gate plug 145 and dummy gate pillars 142 using a selective isotropic etch.

In one or more embodiments, a gate dielectric layer 190 can be formed on the exposed surfaces of the vertical fins 120, bottom isolation layer 135, dummy gate plug 145, and dummy gate pillars 142. The gate dielectric layer 190 can be formed by a conformal deposition (e.g., ALD, PEALD).

In one or more embodiments, the gate dielectric layer 190 can be a dielectric material, including, but not limited to, silicon oxide (SiO), silicon nitride (SiN), a high-K dielectric material, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 190 can have a thickness in a range of about 1 nm to about 3 nm, or about 2 nm, although other thicknesses are also contemplated.

Figure 16:
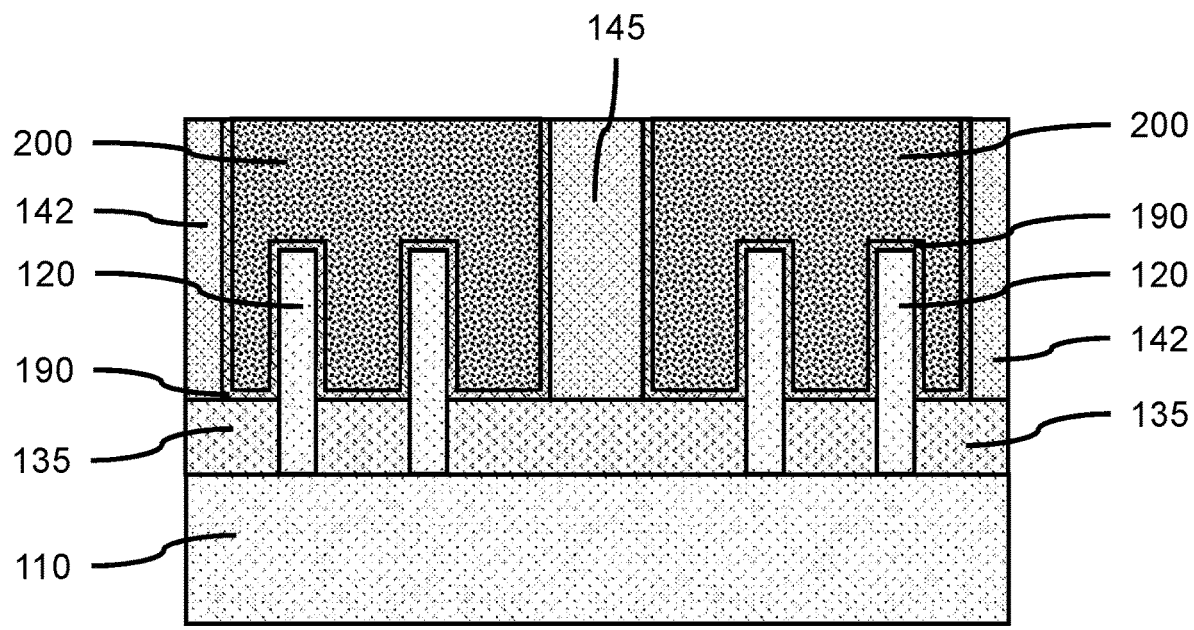
FIG. 16 is a cross-sectional side view perpendicular to FIG. 14 showing a conductive gate layer on the gate dielectric layer and plurality of vertical fins, in accordance with an embodiment of the present invention.

FIG. 16 is a cross-sectional side view perpendicular to FIG. 14 showing a conductive gate layer on the gate dielectric layer and plurality of vertical fins, in accordance with an embodiment of the present invention.

In one or more embodiments, a conductive gate layer 200 can be formed on the gate dielectric layer 190, where the conductive gate layer 200 can be formed by a conformal deposition (e.g., ALD, PEALD), a blanket deposition, for example, CVD, PECVD, metalorganic chemical vapor deposition (MOCVD), or combinations thereof.

In one or more embodiments, the conductive gate layer 200 can be any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti$_3$Al, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

In various embodiments, a CMP can be used to planarize the conductive gate layer 200.

In various embodiments, the dummy gate plug 145 can physically separate and electrically isolate the gate segments forming active gate structures on opposite sides of the dummy gate plug. The gate dielectric layer 190 on the dummy gate plug 145 and bottom isolation layer 135 can further electrically insulate the adjacent active gate structures including the gate dielectric layer 190 and conductive gate layer 200.

Figure 17:
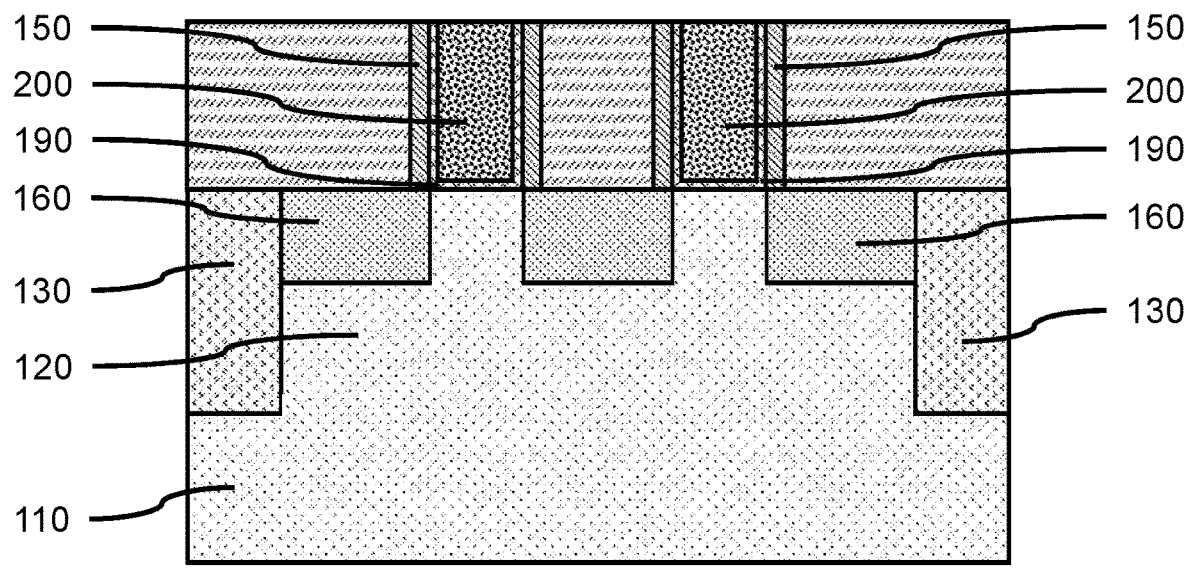
FIG. 17 is a cross-sectional side view showing the long axis of the vertical fin with the dummy gates replaced with the gate dielectric layer and conductive gate layer, in accordance with an embodiment of the present invention.

FIG. 17 is a cross-sectional side view showing the long axis of the vertical fin with the dummy gates replaced with the gate dielectric layer and conductive gate layer, in accordance with an embodiment of the present invention.

In one or more embodiments, the gate dielectric layer 190 and conductive gate layer 200 can be between sidewall spacers 150 and over the vertical fin 120 to form an active gate structure.

Figure 18:
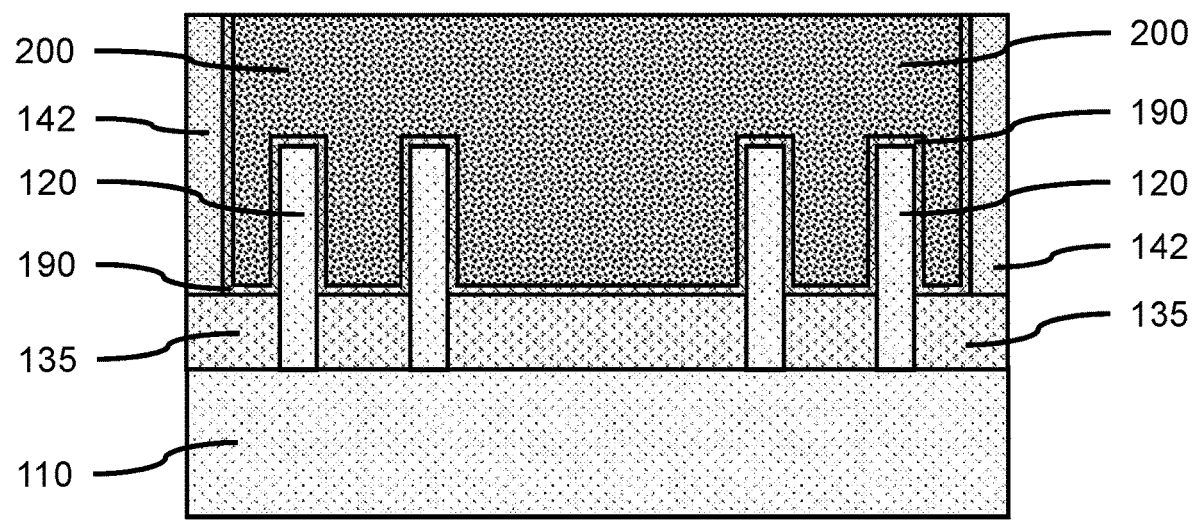
FIG. 18 is a cross-sectional side view perpendicular to FIG. 17 showing the conductive gate layer and gate dielectric layer extending across the plurality of vertical fins, in accordance with an embodiment of the present invention.

FIG. 18 is a cross-sectional side view perpendicular to FIG. 17 showing the conductive gate layer and gate dielectric layer extending across the plurality of vertical fins, in accordance with an embodiment of the present invention.

In one or more embodiments, the gate dielectric layer 190 and conductive gate layer 200 can form an active gate structure across all of the plurality of vertical fins 120.

Figure 19:
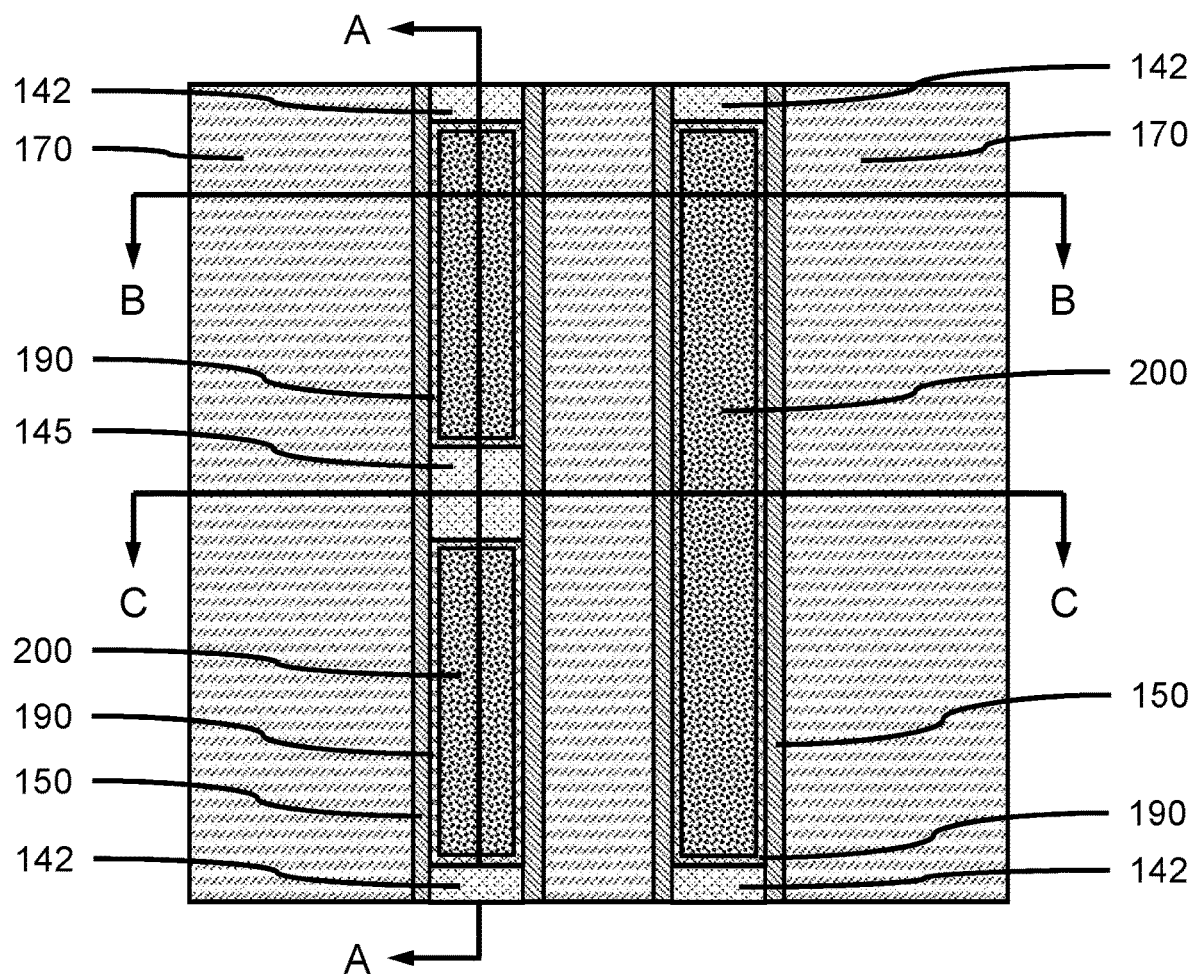
FIG. 19 is a top view showing the a segmented gate structure formed over different vertical fins with a dummy gate plug between the two gate segments, and a shared gate structure formed across the plurality of vertical fins, in accordance with an embodiment of the present invention.

FIG. 19 is a top view showing the a segmented gate structure formed over different vertical fins with a dummy gate plug between the two gate segments, and a shared gate structure formed across the plurality of vertical fins, in accordance with an embodiment of the present invention.

In one or more embodiments, a segmented gate structure can be formed over different subsets of the plurality of vertical fins with the dummy gate plug 145 between the two active gate segments. A shared gate structure can be formed across the plurality of vertical fins. The dummy gate pillars 142 can be at opposite ends of the shared gate structure and two gate segments.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a complementary metal oxide semiconductor (CMOS) device, comprising:
    forming a masking block on a central portion of a dummy gate;
    removing the portions of the dummy gate not covered by the masking block, wherein the portion of the dummy gate covered by the masking block forms a dummy gate plug between an adjacent pair of two or more vertical fins;
    forming a first portion of a first gate dielectric layer on exposed surfaces of one or more vertical fins and a first sidewall of the dummy gate plug and a second portion of the first gate dielectric layer on exposed surfaces of one or more additional vertical fins and a second sidewall of the dummy gate plug opposite the first sidewall, wherein the dummy gate plug is on a bottom isolation layer; and
    forming a first conductive gate layer on the first and second portions of the first gate dielectric layer, wherein the dummy gate plug physically separates a first portion of the first conductive gate layer on the first portion of the first gate dielectric layer from a second portion of the first conductive gate layer on the second portion of the first gate dielectric layer.

2. The method of claim 1, wherein the dummy gate plug is made of amorphous carbon (a-C).

3. The method of claim 1, wherein the bottom isolation layer is between the first and second portions of the gate dielectric layer and a substrate.

4. The method of claim 1, wherein the dummy gate plug has a width, $W_{DG}$, in a range of about 20 nm to about 30 nm.

5. The method of claim 1, further comprising forming a second gate dielectric layer on exposed surfaces of the one or more vertical fins and the one or more additional vertical fins.

6. The method of claim 5, further comprising forming a second conductive gate layer on the second gate dielectric layer.

7. The method of claim 6, wherein the first portion of the first conductive gate layer on the first portion of the first gate dielectric layer forms a first gate structure on the one or more vertical fins, the second portion of the first conductive gate layer on the second portion of the first gate dielectric layer forms a second gate structure on the one or more additional vertical fins, and the second conductive gate layer on the second gate dielectric layer forms a third gate structure across the one or more vertical fins and the one or more additional vertical fins.

8. The method of claim 7, further comprising forming a plurality of source/drains on each of the plurality of vertical fins.

9. The method of claim 8, wherein the first gate structure, second gate structure, and third gate structure forms the complementary metal oxide semiconductor (CMOS) device with the dummy gate plug between the first gate structure and second gate structure.

10. A method of forming a complementary metal oxide semiconductor (CMOS) device, comprising:
    forming at least two dummy gates across a plurality of adjacent vertical fins and over a bottom isolation layer on a substrate, wherein the at least two dummy gates are not made of a conductor or semiconductor material;
    forming sidewall spacers on opposites sides of each of the at least two dummy gates;
    forming a masking block on a central portion of one of the at least two dummy gates;
    removing the portions of the at least two dummy gates not covered by the masking block, wherein the portion of the one dummy gate covered by the masking block forms a dummy gate plug between the sidewall spacers;
    forming a gate dielectric layer on exposed surfaces of the plurality of vertical fins, bottom isolation layer, and dummy gate plug; and
    forming a conductive gate layer on the gate dielectric layer, wherein the dummy gate plug physically separates two active gate structures.

11. The method of claim 10, wherein the at least two dummy gates are made of amorphous carbon (a-C).

12. The method of claim 10, wherein the dummy gate plug has a width, $W_{DG}$, in a range of about 20 nm to about 30 nm.

13. The method of claim 10, wherein the at least two dummy gates have a width in a range of about 15 nm to about 50 nm.

14. The method of claim 10, wherein the substrate is a semiconductor-on-insulator (SeOI) substrate.

15. A complementary metal oxide semiconductor (CMOS) device, comprising:
    an insulating dummy gate plug between a pair of adjacent vertical fins on a substrate, wherein the insulating dummy gate plug has a first sidewall, a second sidewall, and a thickness therebetween;
    a first gate dielectric layer and a first conductive gate layer on one of the pair of vertical fins and the first sidewall of the insulating dummy gate plug;
    a second gate dielectric layer and a second conductive gate layer on another one of the pair of vertical fins and the second sidewall of the insulating dummy gate plug; and
    a third gate dielectric layer and a third conductive gate layer on both adjacent vertical fins.

16. The complementary metal oxide semiconductor (CMOS) device of claim 15, wherein the dummy gate plug is made of amorphous carbon (a-C).

17. The complementary metal oxide semiconductor (CMOS) device of claim 15, wherein the dummy gate plug has a width, $W_{DG}$, in a range of about 20 nm to about 30 nm.

18. The complementary metal oxide semiconductor (CMOS) device of claim 15, wherein the substrate is a semiconductor-on-insulator (SeOI) substrate.

19. The complementary metal oxide semiconductor (CMOS) device of claim 15, further comprising a bottom isolation layer on the substrate between the pair of vertical fins, wherein the bottom isolation layer is between the dummy gate plug and the substrate.

* * * * *